(12) United States Patent
Bower et al.

(10) Patent No.: US 10,164,404 B2
(45) Date of Patent: Dec. 25, 2018

(54) CRYSTALLINE COLOR-CONVERSION DEVICE

(71) Applicant: X-Celeprint Limited, Cork (IE)

(72) Inventors: Christopher Bower, Raleigh, NC (US); Matthew Meitl, Durham, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/785,105

(22) Filed: Oct. 16, 2017

(65) Prior Publication Data

US 2018/0041005 A1 Feb. 8, 2018

Related U.S. Application Data

(63) Continuation of application No. 14/834,009, filed on Aug. 24, 2015, now Pat. No. 9,871,345.

(Continued)

(51) Int. Cl.
*H01S 5/00* (2006.01)
*H01S 5/04* (2006.01)
(Continued)

(52) U.S. Cl.
CPC ............ *H01S 5/041* (2013.01); *H01S 3/0915* (2013.01); *H01S 5/005* (2013.01); *H01S 5/32* (2013.01);
(Continued)

(58) Field of Classification Search
CPC ......... H01L 2924/00; H01L 2924/0002; H01L 2924/01322; H01L 2924/12033;
(Continued)

(56) References Cited

U.S. PATENT DOCUMENTS 4,746,202 A 5/1988 Perilloux et al.
5,060,027 A 10/1991 Hart et al.
(Continued)

FOREIGN PATENT DOCUMENTS

CN 103677427 A 3/2014
EP 1662301 A1 5/2006
(Continued)

OTHER PUBLICATIONS

Choi, H. W. et al., Efficient GaN-based Micro-LED Arrays, Mat. Res. Soc. Symp. Proc. 743:L6.28.1-L6.28.6 (2003).
(Continued)

*Primary Examiner* — Edward Chin
(74) *Attorney, Agent, or Firm* — William R. Haulbrook; Michael D. Schmitt; Choate, Hall & Stewart LLP

(57) ABSTRACT

According to an embodiment, a crystalline color-conversion device includes an electrically driven first light emitter, for example a blue or ultraviolet LED, for emitting light having a first energy in response to an electrical signal. An inorganic solid single-crystal direct-bandgap second light emitter having a bandgap of a second energy less than the first energy is provided in association with the first light emitter. The second light emitter is electrically isolated from, located in optical association with, and physically connected to the first light emitter so that in response to the electrical signal the first light emitter emits first light that is absorbed by the second light emitter and the second light emitter emits second light having a lower energy than the first energy.

8 Claims, 9 Drawing Sheets

Related U.S. Application Data

(60) Provisional application No. 62/173,200, filed on Jun. 9, 2015.

(51) Int. Cl.
*H01S 5/32* (2006.01)
*H01S 5/40* (2006.01)
*H01S 3/0915* (2006.01)
*H01S 5/022* (2006.01)
*H01S 5/323* (2006.01)

(52) U.S. Cl.
CPC ........ *H01S 5/4025* (2013.01); *H01S 5/02252* (2013.01); *H01S 5/02276* (2013.01); *H01S 5/02296* (2013.01); *H01S 5/32341* (2013.01)

(58) Field of Classification Search
CPC . H01L 2924/12041; H01L 2924/13064; H01L 2924/13091; H01L 2924/14; H01L 2924/15787; H01L 2924/15788; H01L 2924/181; H01L 33/007
USPC ............ 257/E33.008, 13, E21.499, E21.502, 257/E29.168, E33.059, 103, 14, 184, 200, 257/76, 88, 94; 438/27, 107, 126, 127, 438/28, 37, 44
See application file for complete search history.

(56) References Cited

U.S. PATENT DOCUMENTS

| | | | |
|---|---|---|---|
| 5,550,066 A | 8/1996 | Tang et al. | |
| 5,621,555 A | 4/1997 | Park | |
| 5,625,202 A * | 4/1997 | Chai | ............ H01L 33/007 257/103 |
| 5,748,161 A | 5/1998 | Lebby et al. | |
| 5,815,303 A | 9/1998 | Berlin | |
| 5,994,722 A | 11/1999 | Averbeck et al. | |
| 6,025,730 A | 2/2000 | Akram et al. | |
| 6,084,579 A | 7/2000 | Hirano | |
| 6,087,680 A | 7/2000 | Gramann et al. | |
| 6,142,358 A | 11/2000 | Cohn et al. | |
| 6,143,672 A | 11/2000 | Ngo et al. | |
| 6,169,294 B1 | 1/2001 | Biing-Jye et al. | |
| 6,184,477 B1 | 2/2001 | Tanahashi | |
| 6,278,242 B1 | 8/2001 | Cok et al. | |
| 6,288,824 B1 | 9/2001 | Kastalsky | |
| 6,340,999 B1 | 1/2002 | Masuda et al. | |
| 6,392,340 B2 | 5/2002 | Yoneda et al. | |
| 6,403,985 B1 | 6/2002 | Fan et al. | |
| 6,410,942 B1 | 6/2002 | Thibeault et al. | |
| 6,466,281 B1 | 10/2002 | Huang et al. | |
| 6,504,180 B1 | 1/2003 | Heremans et al. | |
| 6,577,367 B2 | 6/2003 | Kim | |
| 6,650,382 B1 | 11/2003 | Sumida et al. | |
| 6,660,457 B1 | 12/2003 | Imai et al. | |
| 6,703,780 B2 | 3/2004 | Shiang et al. | |
| 6,717,560 B2 | 4/2004 | Cok et al. | |
| 6,756,576 B1 | 6/2004 | McElroy et al. | |
| 6,812,637 B2 | 11/2004 | Cok et al. | |
| 6,828,724 B2 | 12/2004 | Burroughes | |
| 6,933,532 B2 | 8/2005 | Arnold et al. | |
| 6,969,624 B2 | 11/2005 | Iwafuchi et al. | |
| 6,975,369 B1 | 12/2005 | Burkholder | |
| 7,009,220 B2 | 3/2006 | Oohata | |
| 7,012,382 B2 | 3/2006 | Cheang et al. | |
| 7,091,523 B2 | 8/2006 | Cok et al. | |
| 7,098,589 B2 | 8/2006 | Erchak et al. | |
| 7,127,810 B2 | 10/2006 | Kasuga et al. | |
| 7,129,457 B2 | 10/2006 | McElroy et al. | |
| 7,195,733 B2 | 3/2007 | Rogers et al. | |
| 7,259,391 B2 | 8/2007 | Liu et al. | |
| 7,288,753 B2 | 10/2007 | Cok | |
| 7,402,951 B2 | 7/2008 | Cok | |
| 7,417,648 B2 | 8/2008 | Credelle | |
| 7,420,221 B2 | 9/2008 | Nagai | |
| 7,466,075 B2 | 12/2008 | Cok et al. | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,614,757 B2 | 11/2009 | Nesterenko et al. | |
| 7,622,367 B1 | 11/2009 | Nuzzo et al. | |
| 7,629,955 B2 | 12/2009 | Asao et al. | |
| 7,662,545 B2 | 2/2010 | Nuzzo et al. | |
| 7,687,812 B2 | 3/2010 | Louwsma et al. | |
| 7,704,684 B2 | 4/2010 | Rogers et al. | |
| 7,791,271 B2 | 9/2010 | Cok et al. | |
| 7,799,699 B2 | 9/2010 | Nuzzo et al. | |
| 7,816,856 B2 | 10/2010 | Cok et al. | |
| 7,834,541 B2 | 11/2010 | Cok | |
| 7,872,722 B2 | 1/2011 | Kimura | |
| 7,893,612 B2 | 2/2011 | Cok | |
| 7,898,734 B2 | 3/2011 | Coleman et al. | |
| 7,919,342 B2 | 4/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,948,172 B2 | 5/2011 | Cok et al. | |
| 7,969,085 B2 | 6/2011 | Cok | |
| 7,972,875 B2 | 7/2011 | Rogers et al. | |
| 7,982,296 B2 | 7/2011 | Nuzzo et al. | |
| 7,990,058 B2 * | 8/2011 | Cok | ............ H01L 27/322 313/503 |
| 7,999,454 B2 | 8/2011 | Winters et al. | |
| 8,004,758 B2 | 8/2011 | Coleman et al. | |
| 8,029,139 B2 | 10/2011 | Ellinger et al. | |
| 8,039,847 B2 | 10/2011 | Nuzzo et al. | |
| 8,058,663 B2 | 11/2011 | Fan et al. | |
| 8,198,621 B2 | 6/2012 | Rogers et al. | |
| 8,207,547 B2 | 6/2012 | Lin | |
| 8,243,027 B2 | 8/2012 | Hotelling et al. | |
| 8,261,660 B2 | 9/2012 | Menard | |
| 8,288,843 B2 | 10/2012 | Kojima et al. | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,450,927 B2 | 5/2013 | Lenk et al. | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,536,584 B2 | 9/2013 | Yao | |
| 8,581,827 B2 | 11/2013 | Park et al. | |
| 8,596,846 B2 | 12/2013 | Yankov et al. | |
| 8,619,011 B2 | 12/2013 | Kimura | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,735,932 B2 | 5/2014 | Kim et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,817,369 B2 | 8/2014 | Daiku | |
| 8,829,663 B2 | 9/2014 | Pohl et al. | |
| 8,836,624 B2 | 9/2014 | Roberts et al. | |
| 8,854,294 B2 | 10/2014 | Sakariya | |
| 8,860,051 B2 | 10/2014 | Fellows et al. | |
| 8,877,648 B2 | 11/2014 | Bower et al. | |
| 8,884,844 B2 | 11/2014 | Yang et al. | |
| 8,889,485 B2 | 11/2014 | Bower | |
| 8,895,406 B2 | 11/2014 | Rogers et al. | |
| 8,902,152 B2 | 12/2014 | Bai et al. | |
| 8,912,020 B2 | 12/2014 | Bedell et al. | |
| 8,946,760 B2 | 2/2015 | Kim | |
| 8,987,765 B2 | 3/2015 | Bibl et al. | |
| 9,048,449 B2 | 6/2015 | Kim et al. | |
| 9,105,813 B1 | 8/2015 | Chang | |
| 9,153,171 B2 | 10/2015 | Sakariya et al. | |
| 9,178,123 B2 | 11/2015 | Sakariya et al. | |
| 9,202,996 B2 | 12/2015 | Orsley et al. | |
| 9,226,361 B2 | 12/2015 | Toth | |
| 9,277,618 B2 | 3/2016 | Odnoblyudov et al. | |

(56) References Cited

U.S. PATENT DOCUMENTS

| | | |
|---|---|---|
| 9,293,422 B1 | 3/2016 | Parsa et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,818,725 B2 | 11/2017 | Bower et al. |
| 9,871,345 B2 | 1/2018 | Bower et al. |
| 9,980,341 B2 | 5/2018 | Bower et al. |
| 9,997,501 B2 | 6/2018 | Bower et al. |
| 2001/0022564 A1 | 9/2001 | Youngquist et al. |
| 2002/0096994 A1 | 7/2002 | Iwafuchi et al. |
| 2003/0001165 A1* | 1/2003 | Taki .......... H01L 33/08 |
| | | 257/94 |
| 2004/0080483 A1 | 4/2004 | Chosa |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1* | 6/2005 | Park .......... H01L 27/3209 |
| | | 313/504 |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0211734 A1 | 9/2008 | Huitema et al. |
| 2008/0296717 A1 | 12/2008 | Beroz et al. |
| 2009/0045420 A1 | 2/2009 | Eng et al. |
| 2009/0146921 A1 | 6/2009 | Takahashi |
| 2009/0278142 A1 | 11/2009 | Watanabe et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1* | 12/2010 | Rogers .......... H01L 25/0753 |
| | | 438/27 |
| 2010/0321414 A1 | 12/2010 | Muroi et al. |
| 2010/0328268 A1 | 12/2010 | Teranishi et al. |
| 2011/0032277 A1 | 2/2011 | Lee et al. |
| 2011/0043435 A1 | 2/2011 | Hebenstreit et al. |
| 2011/0069013 A1 | 3/2011 | Rabenstein et al. |
| 2011/0108800 A1* | 5/2011 | Pan .......... H01L 21/0237 |
| | | 257/14 |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2012/0056835 A1 | 3/2012 | Choo et al. |
| 2012/0062135 A1 | 3/2012 | Tamaki et al. |
| 2012/0105518 A1 | 5/2012 | Kang et al. |
| 2012/0126229 A1 | 5/2012 | Bower |
| 2012/0141799 A1* | 6/2012 | Kub .......... B82Y 30/00 |
| | | 428/408 |
| 2012/0206428 A1 | 8/2012 | Cok |
| 2012/0223636 A1* | 9/2012 | Shin .......... C09K 11/7721 |
| | | 313/512 |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1* | 10/2012 | Yoon .......... G02F 1/133603 |
| | | 257/13 |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0128585 A1 | 5/2013 | Bibl et al. |
| 2013/0153277 A1 | 6/2013 | Menard et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0027709 A1 | 1/2014 | Higginson et al. |
| 2014/0082934 A1 | 3/2014 | Cok |
| 2014/0084482 A1 | 3/2014 | Hu et al. |
| 2014/0085214 A1 | 3/2014 | Cok |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1* | 5/2014 | Kim .......... G02F 1/133536 |
| | | 349/65 |
| 2014/0159043 A1 | 6/2014 | Sakariya et al. |
| 2014/0159065 A1 | 6/2014 | Hu et al. |
| 2014/0175498 A1 | 6/2014 | Lai |
| 2014/0183446 A1* | 7/2014 | Nago .......... H01L 33/007 |
| | | 257/13 |
| 2014/0192079 A1 | 7/2014 | Lee et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1* | 10/2014 | Ahn .......... H01L 33/62 |
| | | 257/88 |
| 2014/0319486 A1 | 10/2014 | Hong |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2015/0003040 A1 | 1/2015 | Bessho et al. |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0179453 A1 | 6/2015 | Cheng et al. |
| 2015/0263066 A1 | 9/2015 | Hu et al. |
| 2015/0280066 A1 | 10/2015 | Fujimura et al. |

(56) References Cited

U.S. PATENT DOCUMENTS

| | | |
|---|---|---|
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372187 A1 | 12/2015 | Bower et al. |
| 2016/0004123 A1 | 1/2016 | Tanabe |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0085120 A1 | 3/2016 | Xu |
| 2016/0093600 A1 | 3/2016 | Bower et al. |
| 2016/0131329 A1 | 5/2016 | Park et al. |
| 2016/0211245 A1 | 7/2016 | Do |
| 2016/0260388 A1 | 9/2016 | Yata et al. |
| 2016/0266697 A1 | 9/2016 | Cheng et al. |
| 2016/0364030 A1 | 12/2016 | Peana et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0352646 A1 | 12/2017 | Bower et al. |
| 2017/0357127 A1 | 12/2017 | Cok et al. |
| 2017/0358717 A1 | 12/2017 | Cok et al. |
| 2018/0033853 A1 | 2/2018 | Bower et al. |
| 2018/0084614 A1 | 3/2018 | Bower et al. |
| 2018/0119931 A1 | 5/2018 | Bower et al. |
| 2018/0130400 A1 | 5/2018 | Meitl et al. |
| 2018/0211945 A1 | 7/2018 | Cok et al. |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11-142878 | 5/1999 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |
| WO | WO-2017/174632 A1 | 10/2017 |

OTHER PUBLICATIONS

Cok, R. S. et al., AMOLED displays with transfer-printed integrated circuits, Journal of SID 19/(4):335-341(2011).

Hamer et al., 63.2: AMOLED Displays Using Transfer-Printed Integrated Circuits, SID 09 Digest, 40(2):947-950 (2009).

International Search Report, PCT/EP2015/063709, dated Dec. 15, 2015, 6 pages.

International Search Report, PCT/EP2015/069553, dated Nov. 27, 2015, 6 pages.

Johnson, K. et al., Advances in Red VCSEL Technology, Advances in Optical Technologies, 2012:569379, 13 pages (2012).

Kasahara, D. et al, Nichia reports first room-temperature blue/'green' VCSELs with current injection, Appl. Phys. Express, 4(7):3 pages (2011).

Koma, N. et al., 44.2: Novel Front-light System Using Fine-pitch Patterned OLED, SID, 08:655-658 (2008).

Lee, S. H. etal, Laser Lift-Offof GaN Thin Film and its Application to the Flexible Light Emitting Diodes, Proc. of SPIE 8460:846011-1-846011-6 (2012).

Matioli, E. et al., High-brightness polarized light-emitting diodes, Light: Science & Applications, 1:e22:1-7 (2012).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

Seurin, J.F. et al, High-power red VCSEL arrays, Proc. of SPIE 8639:1-9 (2013).

Yaniv et al., A 640 × 480 Pixel Computer Display Using Pin Diodes with Device Redundancy, 1988 International Display Research Conference, IEEE, CH-2678-1/88:152-154 (1988).

Yoon, J. et al., Heterogeneously Integrated Optoelectronic Devices Enabled by MicroTransfer Printing, Adv. Optical Mater. 3:1313-1335 (2015).

* cited by examiner

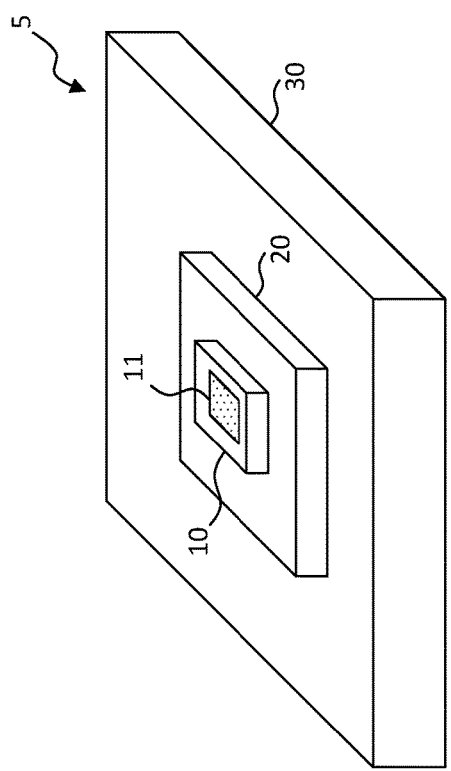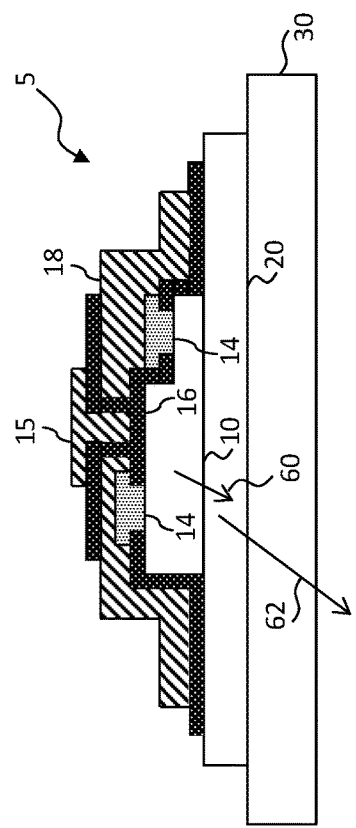

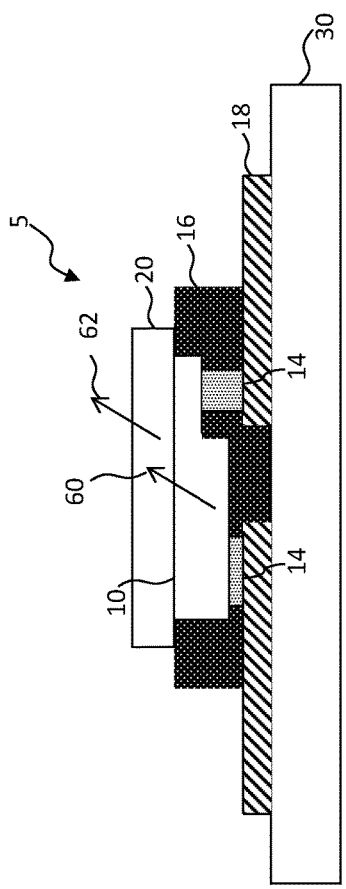
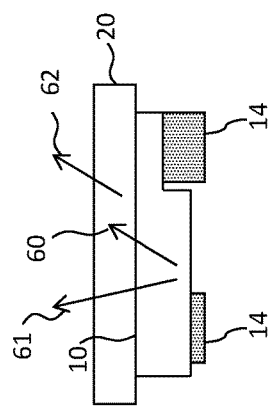

CRYSTALLINE COLOR-CONVERSION DEVICE

PRIORITY APPLICATION

This application claims priority to and the benefit of U.S. Provisional Patent Application No. 62/173,200, filed Jun. 9, 2015, titled "Crystalline Color-Conversion Device," the content of which is incorporated by reference herein in its entirety.

FIELD OF THE INVENTION

The present invention relates to light-emitting structures using an electrically driven light emitter to optically pump an inorganic solid single-crystal direct-bandgap light emitter.

BACKGROUND OF THE INVENTION

Solid-state electrically controlled light emitters are widely used in the display and lighting industries. Displays often use differently colored emitters, and lighting applications require a large color rendering index (CRI). In either case, the efficient production of a variety of colors is important.

Colored light is produced in liquid crystal displays (LCDs) and some organic light-emitting diode (OLED) displays using white-light emitters (such as a backlight) and color filters, for example as taught in U.S. Pat. No. 6,392,340. However, this approach has the disadvantage of wasting much of the white light produced by the back light. In a different approach, light emitters emit a specific desired color. For example, some OLED displays use different organic materials to emit light of different colors. This design requires the patterned distribution of the different organic materials over a display substrate at a micron-level resolution, for example using evaporation through a mechanical shadow mask. However, it is difficult to maintain pattern accuracy using metal shadow masks over large display substrates, for example greater than 300 mm by 400 mm, or display substrates requiring high resolution.

Inorganic light-emitting diodes (LEDs) based on crystalline semiconductor materials are also used to emit light of different frequencies. These crystalline-based inorganic LEDs provide high brightness, excellent color saturation, long lifetimes, good environmental stability, and do not require expensive encapsulation for device operation, especially in comparison to OLEDs. However, the crystalline semiconductor layers also have a number of disadvantages. For example, crystalline-based inorganic LEDs have high manufacturing costs, difficulty in combining multi-color output from the same chip, low efficiency, color variability and poor electrical current response.

Most solid-state lighting products desirably emit white light with a large color rendering index, for example greater than 80 or even 90. Since solid-state light emitters emit colored rather than white light, multiple different colored solid-state light emitters are often used to provide the appearance of white light. For example, LED backlights in LCDs, or white OLED emitters in some OLED displays, use a combination of blue and yellow emitters or red, green, and blue emitters that together are experienced as white light by the human visual system. However, this technique requires the use of different light emitters that emit different colors of light. As noted above, different light emitters have different electrical and colorimetric properties leading to inefficiency and non-uniformity.

Another technique used to provide colored light is color conversion, in which a single kind of light emitter is used to optically stimulate (pump) a second light emitter with light having a first energy (frequency). The second light emitter absorbs the first light and then emits second light having a lower energy (frequency). By choosing a variety of different second light emitters that emit light of different frequencies, a display or a solid-state light device can emit light of different colors. For example, a blue light emitter can be used to emit blue light and to optically pump yellow, red, or green light emitters. U.S. Pat. No. 7,990,058 describes an OLED device with a color-conversion material layer.

Phosphors are often used as color-conversion materials. For example, U.S. Pat. No. 8,450,927 describes an LED lamp using a phosphor and U.S. Pat. No. 7,969,085 discloses a color-change material layer that converts light of a second frequency range higher than a first frequency range to light of the first frequency range. Light-emissive inorganic core/shell nano-particles (quantum dots or QDs) are also used to produce optically pumped or electrically stimulated colored light, for example as taught in U.S. Pat. No. 7,919,342.

In general, color-change material systems suffer from efficiency problems. For example, the production of relatively higher-frequency blue light can be difficult and the conversion of light from relatively higher frequencies to relatively lower frequencies may not be efficient. Moreover, the conversion materials may fade over time, reducing the performance of the display. Furthermore, much of the relatively higher-frequency light may not interact with the color-change materials and thus may not be converted to the desired, relatively lower frequency light. U.S. Patent Publication 2005/0140275A1 describes the use of red, green, and blue conversion layers for converting white light into three primary colors of red, green, and blue light. However, the efficiency of emitted-light conversion remains a problem.

Diode-pumped solid-state lasers use a solid gain medium such as a neodymium-doped yttrium aluminum garnet crystal. Light from one or more light-emitting diodes is imaged with a lens or optical fiber onto one or more sides of the crystal. The crystal then lases to produce coherent light.

Inorganic displays use arrays of inorganic light emitters, typically light-emitting diodes (LEDs). Because of the variability in LED materials and manufacturing processes, different LEDs, even when made in similar materials, will have different performances and losses in the circuits providing power to the different LEDs. LEDs made in different materials have even greater inefficiencies when provided with a common power source. Furthermore, these issues are exacerbated in LEDs since the variability of materials in a source semiconductor wafer is much greater on a smaller scale than on a larger scale. These differences lead to performance inefficiency and uniformity variations.

Although a variety of devices produce arrays of emitters emitting different colors of light, there remains a need for structures and methods that improve power efficiency and performance uniformity in the production of colored light in a simple and robust structure made with fewer parts.

SUMMARY OF THE INVENTION

The present invention provides a light-emitting structure and display with improved optical efficiency, highly saturated colored light, and improved electrical efficiency. Embodiments of the present invention also enable robust methods of manufacturing.

According to an embodiment, a crystalline color-conversion device includes an electrically driven first light emitter, for example a blue or ultraviolet LED, for emitting light having a first energy in response to an electrical signal. An inorganic solid single-crystal direct-bandgap second light emitter having a bandgap of a second energy less than the first energy is provided in association with the first light emitter. The second light emitter is electrically isolated from, located in optical association with, and located within 0 to 250 microns of the first light emitter so that in response to the electrical signal the first light emitter emits light that is absorbed by the second light emitter and the second light emitter emits light of a lower energy than the first light emitter. Different single-crystal direct-bandgap light emitters emit different colors of light. Arrays of the different crystalline color-conversion devices of the present invention can provide a multi-color pixel display. The first and second light emitters can be in physical contact, i.e. touching, or can be separated by an adhesive layer adhering the first light emitter to the second light emitter, forming a solid-state crystalline color-conversion device.

Crystalline LEDs are efficient light emitters and direct-bandgap crystals efficiently absorb and transmit light. Closely locating the LED to the direct bandgap crystals provides an efficient, solid-state optical structure with few losses in an environmentally and mechanically robust device. Such a structure is also amenable to micro-transfer printing enabling an efficient and low-cost manufacturing method for display devices using the crystalline color-conversion device of the present invention.

In one aspect, the disclosed technology includes a crystalline color-conversion device, including: an electrically driven first light emitter for emitting first light having a first energy in response to an electrical signal; and an inorganic solid single-crystal direct-bandgap second light emitter having a bandgap of a second energy less than the first energy, wherein the second light emitter is electrically isolated from the first light emitter, is located in optical association with the first light emitter, and is located within 0 to 250 microns of the first light emitter so that in response to the electrical signal the first light emitter emits first light that is absorbed by the second light emitter and the second light emitter emits second light having a lower energy than the first energy.

In certain embodiments, the second light emitter has a composition different from the first light emitter.

In certain embodiments, the first light emitter is an inorganic solid single-crystal direct bandgap light emitter.

In certain embodiments, the crystal lattice structure of the first light emitter is different from the crystal lattice structure of the second light emitter.

In certain embodiments, the first light emitter is a light-emitting diode, a laser, or a vertical-cavity surface-emitting laser (VCSEL).

In certain embodiments, the first light emitter is in physical contact with the second light emitter.

In certain embodiments, the device includes a material that is at least partially transparent to the color of light emitted by the first light emitter and is located between and in contact with the first light emitter and the second light emitter.

In certain embodiments, the material is plastic, is an adhesive, is a curable adhesive, is a resin, or is a curable resin, or wherein the material is a dielectric stack that is an optical filter.

In certain embodiments, the second light emitter is at least one of InGaN, bulk or quasi-bulk InGaN, InGaP, InGaAl phosphide, devoid of arsenic, devoid of cadmium, and devoid of rare earths.

In certain embodiments, the second light emitter emits second light that has a peak wavelength of 460 nm or less.

In certain embodiments, the device includes a plurality of first light emitters and a corresponding plurality of second light emitters.

In certain embodiments, each of the plurality of first light emitters has a common material and crystal lattice structure.

In certain embodiments, each of the plurality of first light emitters emits blue or ultraviolet first light.

In certain embodiments, at least some of the plurality of second light emitters are different from others of the plurality of second light emitters.

In certain embodiments, at least one of the plurality of second light emitters emits second light that is red, green, blue, or infrared.

In certain embodiments, at least a first one of the plurality of second light emitters emits red light, a second one of the plurality of second light emitters emits green light, and a third one of the plurality of second light emitters emits blue light.

In certain embodiments, the first light emitter emits white light.

In certain embodiments, the first light emitter emits a third light of a third energy less than the second energy and the third light passes through the second light emitter.

In certain embodiments, the second light emitter comprises at least one of surface passivation, atomic layer deposition surface passivation, light out-coupling structure, light-extraction structures, templated epitaxial structures, and holes.

In certain embodiments, the second light emitter has a thickness large enough to convert substantially all incident first light from the first light emitter having an energy greater than the second energy to light of the second energy.

In certain embodiments, the second light emitter has a thickness chosen to convert a pre-determined fraction of the incident first light having an energy greater than the second energy to light of the second energy.

In certain embodiments, the device includes an inorganic solid single-crystal direct-bandgap third light emitter having a bandgap of a third energy less than the first energy, the third light emitter located on a side of the second light emitter opposite the first light emitter.

In certain embodiments, the second light emitter has at least a first portion having a first thickness and a second portion having a second thickness less than the first thickness, the first thickness large enough to convert substantially all incident first light having an energy greater than the second energy to light of the second energy and the second thickness small enough that a substantial amount of incident first light having an energy greater than the second energy is not converted to light of the second energy.

In certain embodiments, the second light emitter comprises a cavity in which the first light emitter is disposed.

In certain embodiments, the second light emitter comprises inorganic direct-bandgap crystals that are disposed on multiple sides of the first light emitter to partially surround the first light emitter.

In certain embodiments, the device includes a plurality of first light emitters in optical association with the second light emitter.

In certain embodiments, the device includes an inorganic solid single-crystal direct-bandgap third light emitter having a bandgap of a third energy less than the first energy and that is electrically isolated from the first light emitter.

In certain embodiments, the third light emitter is located in optical association with the first light emitter and is located within 0 to 250 microns of the first light emitter so that in response to the electrical signal the first light emitter emits first light that is absorbed by the third light emitter and the third light emitter emits third light having a lower energy than the first energy.

In certain embodiments, the third light emitter has a bandgap of a third energy less than the second energy, the third light emitter is located in optical association with the second light emitter, and is located within 0 to 250 microns of the second light emitter so that light emitted by the second light emitter is absorbed by the third light emitter and the third light emitter emits third light having a lower energy than the second energy.

In certain embodiments, the device includes a reflective layer located at least partially over the first light emitter or the second light emitter, or both the first light emitter and the second light emitter, that reflects light emitted by the first or second light emitters in undesirable directions.

In certain embodiments, the second light emitter is an optically pumped laser.

In certain embodiments, the second light emitter includes a light-extraction structure.

In certain embodiments, the device includes an electrically connected electrostatic gate formed on, under, or over a near-edge region of the second light emitter.

In certain embodiments, the second light emitter is a semiconductor heterostructure comprising two different semiconductor materials or structures.

In certain embodiments, the semiconductor heterostructure has a cladding layer at least partially surrounding an active photoluminescent layer, the cladding layer having an energy bandgap larger than the energy bandgap of the active photoluminescent layer.

In certain embodiments, the cladding layer has an energy bandgap larger than the energy bandgap of the first emitter or wherein the cladding layer has an energy bandgap equal to or less than the energy bandgap of the first emitter and a thickness that is less than the thickness of the photoluminescent layer.

In certain embodiments, the second light emitter is less than or equal to two microns thick.

In certain embodiments, the second light has a full width half max (FWHM) less than or equal to 50 nm.

In certain embodiments, at least one of the first light emitter and second light emitter has a width from 2 to 5 μm, 5 to 10 μm, 10 to 20 μm, or 20 to 50 μm.

In certain embodiments, at least one of the first light emitter and second light emitter has a length from 2 to 5 μm, 5 to 10 μm, 10 to 20 μm, or 20 to 50 μm.

In certain embodiments, at least one of the first light emitter and second light emitter has with a height from 2 to 5 μm, 4 to 10 μm, 10 to 20 μm, or 20 to 50 μm.

In certain embodiments, the device includes an optical filter disposed on a side of the second light emitter opposite the first light emitter to reflect light from the first light emitter and transmit light emitted from the second light emitter.

In another aspect, the disclosed technology includes a crystalline color-conversion display, the display including: a display substrate; and the plurality of first light emitters and corresponding plurality of second light emitters located on or over the display substrate and distributed over the display substrate.

In certain embodiments, the plurality of second light emitters are grouped into pixel groups, each pixel group including at least a red second light emitter emitting red light, a green second light emitter emitting green light, and a blue second light emitter emitting blue light.

In certain embodiments, each of the plurality of first light emitters has a common material and crystal lattice structure.

In certain embodiments, the second light emitters are located between the first light emitters and the display substrate and the second light emitters emit light through the display substrate.

In certain embodiments, the first light emitters are located between the second light emitters and the display substrate and the second light emitters emit light in a direction opposite the display substrate.

In certain embodiments, the display substrate is a member selected from the group consisting of polymer, plastic, resin, polyimide, polyethylene naphthalate, polyethylene terephthalate, metal, metal foil, glass, a semiconductor, and sapphire.

In certain embodiments, the display substrate has a transparency greater than or equal to 50%, 80%, 90%, or 95% for visible light.

In another aspect, the disclosed technology includes a method of making a crystalline color-conversion device, including: providing an electrically driven first light emitter for emitting first light having a first energy in response to an electrical signal; providing an inorganic solid single-crystal direct-bandgap second light emitter having a bandgap of a second energy less than the first energy; and micro transfer printing the second light emitter onto the first light emitter or micro transfer printing the first light emitter onto the second light emitter, wherein the second light emitter is electrically isolated from the first light emitter, is located in optical association with the first light emitter, and is located within 0 to 250 microns of the first light emitter so that in response to the electrical signal the first light emitter emits first light that is absorbed by the second light emitter and the second light emitter emits second light having a lower energy than the first energy.

In certain embodiments, the first and second light emitters form a light-emitting conversion structure and comprising micro-transfer printing the light-emitting conversion structure onto a display substrate.

In certain embodiments, the method includes forming an inorganic solid single-crystal direct-bandgap layer on a source substrate and disposing the first light emitters onto the layer.

In certain embodiments, the method includes etching the layer to form a plurality of spatially separated crystalline color-conversion devices on the source substrate.

In certain embodiments, the method includes micro transfer printing the crystalline color-conversion devices from the source substrate to a display substrate.

In certain embodiments, the method includes providing an inorganic solid single-crystal direct-bandgap source substrate and disposing the first light emitters onto the layer.

In certain embodiments, the method includes etching the layer to form a plurality of spatially separated crystalline color-conversion devices.

In certain embodiments, the method includes micro transfer printing the crystalline color-conversion devices from the source substrate to a display substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1 is a perspective of an embodiment of the present invention;

FIG. 2 is a cross section of a bottom-emitter embodiment of the present invention;

FIG. 6 is a cross section of a top-emitter embodiment of the present invention;

FIG. 7 is a cross section of a structure in accordance with embodiments of the present invention;

Figure 3:
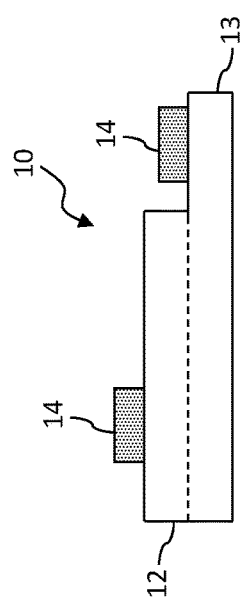
FIG. 3 is a cross section of an LED structure in accordance with embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to FIG. 1, in an embodiment of the present invention a crystalline color-conversion device 5 includes an electrically driven first light emitter 10 for emitting light having a first energy in response to an electrical signal, for example from a controller (not shown), from a light-emitting area 11 within the first light emitter 10. An inorganic solid single-crystal direct-bandgap second light emitter 20 having a bandgap of a second energy less than the first energy is electrically isolated from the first light emitter 10, is located in optical association with the first light emitter 10, and is located within 0 to 250 microns of the first light emitter 10 so that in response to the electrical signal the first light emitter 10 emits first light that is absorbed by the second light emitter 20 and the second light emitter 20 emits second light having a lower energy than the first energy.

As used herein, "in optical association" means that light from the first light emitter 10 is incident upon the second light emitter 20.

As used herein "located within 0 to 250 microns" means that the first light emitter 10 can be in contact with the second light emitter 20 or within, for example, 10, 20, 50, 100, 200, or 250 microns of the second light emitter 20 such that the first light emitter 10 and the second light emitter 20 are separated by a distance from 0 to 250 microns, inclusive. In an embodiment in which the first light emitter 10 is separated from the second light emitter 20, the first light emitter 10 can be adhered to the second light emitter 20 by a thin, transparent adhesive layer. The thin, transparent adhesive layer can have a variable thickness but in any case serves to adhere the first light emitter 10 to the second light emitter 20 without undue absorption of light (e.g., adhesive layer is 80-100% transparent to visible or emitted light), for example the first light emitted by the first light emitter 10.

As illustrated in FIG. 1, the crystalline color-conversion device 5 can be mounted on a substrate 30. The substrate 30 can be a transparent substrate 30 that is substantially transparent to the light emitted by the first or second light emitters 10, 20, for example 50%, 70%, 80%, 90%, or 95% transparent. The substrate 30 can be a polymer, plastic, resin, polyimide, PEN, PET, metal, metal foil, glass, a semiconductor, or sapphire.

In various embodiments, the first light emitter 10 can be, for example, a light-emitting diode, a laser, a diode laser, or a vertical cavity surface emitting laser and can include known light-emitting diode materials and structures. The first light emitter 10 can also be an inorganic solid single-crystal direct bandgap light emitter. The first light emitter 10 can emit blue, violet, or ultra-violet light, and can emit either coherent or incoherent light. The light emitters used herein can have at least one of a width, length, and height from 2 to 5 μm, 4 to 10 μm, 10 to 20 μm, or 20 to 50 μm.

In some embodiments, the second light emitter 20 is a crystal, a semiconductor crystal, or a doped semiconductor crystal. Dopants can include neodymium, chromium, erbium or ytterbium. The second light emitter 20 can include InGaN, bulk or quasi-bulk InGaN, InGaP, InGaAl phosphide, yttrium aluminum garnet, yttrium orthovanadate, beta barium borate, lithium triborate, bismuth triborate, or potassium titanyl phosphate. The second light emitters 20 can be devoid of arsenic, cadmium, or rare earths. The second light emitter 20 can be an optically pumped laser. In an embodiment, the second light emitter 20 emits second light that has a peak wavelength of 460 nm or less or emits red, yellow, green, cyan, or blue light. Because the second light emitted from the second light emitter 20 can be a very pure light and highly saturated, the second light can have a full width half max (FWHM) less than or equal to 50 nm or even less than or equal to 20 nm. Single-crystal direct bandgap semiconductor light emitters can be very efficient at both absorbing incident first light and effective at emitting lower frequency light. Hence, in an embodiment, the second light emitter is less than or equal to two microns thick, or even less than or equal to one micron thick.

In an embodiment of the present invention, the second light emitter 20 has a composition different from the first light emitter 10. The crystal lattice structure of the first light emitter 10 can be different from the crystal lattice structure of the second light emitter 20. The second light emitter 20 can include surface passivation and light out-coupling structures. The surface passivation can be provided, for example, using atomic layer deposition (ALD) and can be only one or a few atoms thick. In embodiments, the refractive index of the second light emitter 20 is much greater than the refractive index of air and the use of light out-coupling or light-extraction structures can facilitate efficient light emission and reduce total internal reflection and heating.

Referring to FIG. 2, a structure of the present invention includes a first light emitter 10 located within 0 to 250 microns of the second light emitter 20, for example in physical contact with the second light emitter 20 as shown. The second light emitter 20 is mounted on the substrate 30. In this embodiment, the first light emitter 10 is an LED formed with electrical contacts 14 on a side of the LED opposite the second light emitter 20. The electrical contacts 14 are electrically connected to conductive wires 18 insulated from the first light-emitter 10 by a dielectric 16. The electrical contacts 14 are driven by control signals, for example from an external controller (not shown), to control the LED to emit first light 60 having the first energy. The first light 60 is absorbed by the second light emitter 20 and the second light emitter 20 emits second light 62 that passes through the substrate 30 and can be viewed by an observer. Thus, the first light emitter 10 optically pumps the second light emitter 20. In an embodiment, a reflector 15 is located over the gap between the electrical contacts 14 and is electrically insulated from the electrical contacts 14 by the dielectric 16. In a further embodiment, a reflective layer (e.g., metal) is disposed at least partially over the second light emitter 20 to reflect light emitted by the first or second light emitters 10, 20 in undesirable directions.

Figure 4:
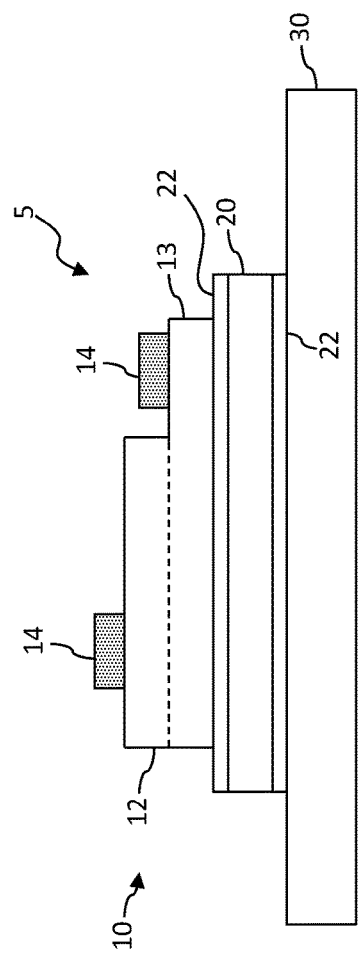
FIG. 4 is a cross section of another embodiment of the present invention having additional material layers.

As shown in the embodiment of FIGS. 3 and 4, the first light emitter 10 is formed in layers, for example including a conduction layer 13 including a transparent doped semiconductor layer, to which is connected an electrical contact 14. The conduction layer 13 efficiently conducts current without emitting light to a light-emitting layer 12 that is also connected to an electrical contact 14. Electrical current flowing through the light-emitting layer 12 causes the light-emitting layer 12 to emit first light 60. The light-emitting layer 12 can also include multiple doped semiconductor sub-layers, for example n- and p-doped sub-layers doped in different amounts or with different dopants.

The second light emitter 20 is located in optical association with and is physically located within 0 to 250 microns of the first light emitter 10. In the embodiment illustrated in FIGS. 1 and 2, the first light emitter 10 is within 0 microns of the second light emitter 20 so that the first light emitter 10 is in physical contact with and touches the second light emitter 20. In such an embodiment, the first and second light-emitters 10 and 20 are not separated by a vacuum or a gas and form a solid-state structure. In yet another embodiment of the crystalline color-conversion device 5 illustrated in FIG. 4, a material 22 that is at least partially transparent (for example 50%, 70%, 80%, 90%, 95%, or 100%) to the color of light emitted by the first light emitter 10 is located between and in physical contact with the first light emitter 10 and the second light emitter 20. The material 22 can be an adhesive, a curable adhesive, a resin, or a curable resin. In an embodiment, the material 22 is an optically clear adhesive (OCA). In a further embodiment and as shown in FIG. 4, the material 22 is also located between the second light emitter and the substrate 30.

In an embodiment, the material 22 is formed in a layer that is substantially planar, is index matched to either or both of the first and second light emitters 10, 20, or does not change the direction of the first light 60 emitted from the first light emitter 10. In another embodiment, the material 22 does not form a lens or demonstrate total internal reflection or have a graded index through the layer of material 22. In a further embodiment, the material 22 layer includes sub-layers forming a dielectric stack. The sub-layers can have different or alternating refractive indices and can be selected to form an optical filter that transmits light emitted light from the first light emitter 10 but reflects light from the second light emitter 20, thereby improving the conversion and light output efficiency of the crystalline color-conversion device 5. Alternatively, one or more layers overlying both the first and second light emitters 10, 20, for example the dielectric insulator 16, serve to hold the first and second light emitters 10, 20 together. In an additional embodiment, an optical filter that can be a dielectric stack is disposed on a side of the second light emitter 20 opposite the first light emitter 10 that reflects light from the first light emitter 10 and transmits light emitted from the second light emitter 20.

In another embodiment of the present invention, the second light emitter 20 incorporates a cavity such as a pocket, receptacle, recess, or hollowed-out portion into which the first light emitter 10 is disposed. The cavity serves as both a mechanical alignment feature when disposing the first light emitter 10 in optical association with the second light emitter 20 or when disposing the second light emitter 20 in optical association with the first light emitter 10. Locating the first light emitter 10 in the cavity of the second light emitter 20 also enables the second light emitter 20 to partially surround the first light emitter 10, so that more light emitted from the first light emitter 10 is converted by the second light emitter 20.

In yet another embodiment of the present invention, the second light emitter 20 includes multiple inorganic direct-bandgap crystals that are disposed on multiple sides of the first light emitter 10 to partially surround the first light emitter 10, so that more light emitted from the first light emitter 10 is converted by the second light emitter 20. The multiple inorganic direct-bandgap crystals can be identical or different, or can have the same thickness or have different thicknesses. The different materials or sizes can produce light of different frequencies.

Alternatively, multiple first light emitters 10 are located in optical association with a single second light emitter 20 so that light emitted by the first light emitters 10 is converted by the single second light emitter 20. The multiple first light emitters 10 can be identical or different, for example including different materials or having different sizes or are driven with different signals or at different time. Such structural alternatives can have mechanical advantages in alignment or disposition of the first and second light emitters 10, 20, improved light conversion efficiency, improved CRI, less flicker, increased power or light emitted from a single crystalline color-conversion device 5, or reduced costs in manufacturing. Such arrangements can also reduce failures if, for example either a second light emitter 20 fails or a first light emitter 10 fails.

Figure 5:
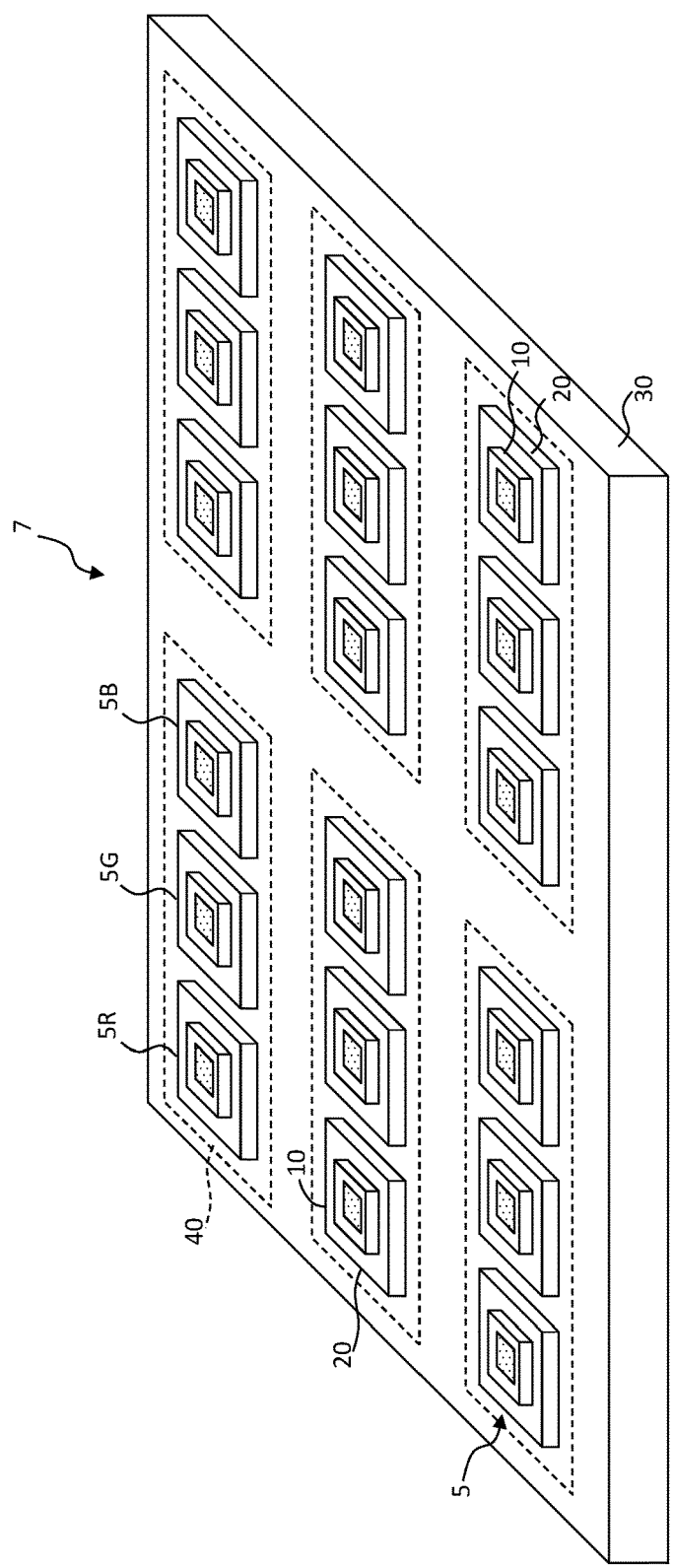
FIG. 5 is a perspective of an embodiment of the present invention having an array of crystalline color-conversion devices.

Referring next to FIG. 5, a crystalline color-conversion display 7 includes a plurality of the crystalline color-conversion devices 5 located on a display substrate 30, each having a first light emitter 10 and a corresponding second light emitter 20. The plurality of crystalline color-conversion devices 5 are distributed over or on the display substrate 30, for example in an array. Groups 40 of the crystalline color-conversion devices 5 including the first and second light emitters 10, 20 can form pixels or sub-pixels in the crystalline color-conversion display 7. Each of the plurality of first light emitters 10 can be the same kind of light emitter and have a common material and crystal lattice structure so that they have similar operating characteristics and can be provided and located on the substrate 30 in a common step. In a further embodiment, at least some of the second light emitters 20 are different from other second light emitters 20, for example so that they emit different colors of light. For example, at least one of the plurality of second light emitters 20 can emit red light, another one of the second light emitters 20 can emit green light, and a third one of the second light emitters 20 can emit blue light so that the crystalline color-conversion display 7 includes crystalline color-conversion devices 5R emitting red light, crystalline color-conversion devices 5G emitting green light, and crystalline color-conversion devices 5B emitting blue light. In another embodiment, at least one of the plurality of second light emitters 20 emits infrared light. Pixel groups 40 can include one each of the crystalline color-conversion devices 5R, 5G, and 5B to form multi-color pixels in the crystalline color-conversion display 7.

In the embodiment illustrated in FIG. 2 the second light emitter 20 is between the substrate 30 and the first light emitter 10 and emits light through the substrate 30 in a bottom-emitter configuration. In an alternative top-emitter configuration illustrated in FIG. 6, the first light emitter 10 is located between the substrate 30 and the second light emitter 20. As shown in FIG. 6, the conductive wires 18 can be formed on the substrate 30 and the first light emitter 10 located over the patterned conductive wires 18 to electrically connect the electrical contacts 14 to the conductive wires 18. The electrical contacts 14 have different thicknesses to facilitate electrical connections from the electrical contacts to the patterned conductive wires on the substrate 30. The dielectric 16 protects and insulates the structure. The second light emitter 20 is in contact with the first light emitter 10 and, as shown in FIG. 7, when stimulated by a current supplied through the electrical contacts 14, the first light emitter 10 emits first light 60 at least a portion of which is absorbed by the second light emitter 20. In response to the first light 60, the second light emitter 20 emits second light 62.

In a further embodiment of the present invention, the first light emitter 10 emits white light, for example a white-light LED. Such solid-state white-light emitters typically emit at least two different colors, for example blue and yellow, and can themselves include color-change materials, such as phosphors. Thus, in such an embodiment the first light emitter 10 also emits third light of a third energy less than the second energy and the light of the third energy passes through the second light emitter 20. As illustrated in FIG. 7, low-energy pump light 61 emitted from the first light emitter 10 passes through the second light emitter 20 and can be viewed by an observer. Higher-energy light (first light 60) can be absorbed by the second light emitter 20 and is emitted as a lower energy light (second light 62 having the second energy). Using this method, a wider variety of colors can be formed or the use of expensive or hard-to-find single-crystal direct-bandgap materials avoided.

In an embodiment of the present invention, the second light emitter 20 has a thickness large enough to convert substantially all incident light having an energy greater than the second energy, for example from the first light emitter 10, to light of the second energy. In another embodiment, the second light emitter 20 has a thickness chosen to convert a pre-determined fraction of the incident light having an energy greater than the second energy, for example first energy light from the first light emitter 10, to light of the second energy. Thus, light having a pre-determined combination of different colors (the first energy light and the second energy light) is emitted.

Figure 8:
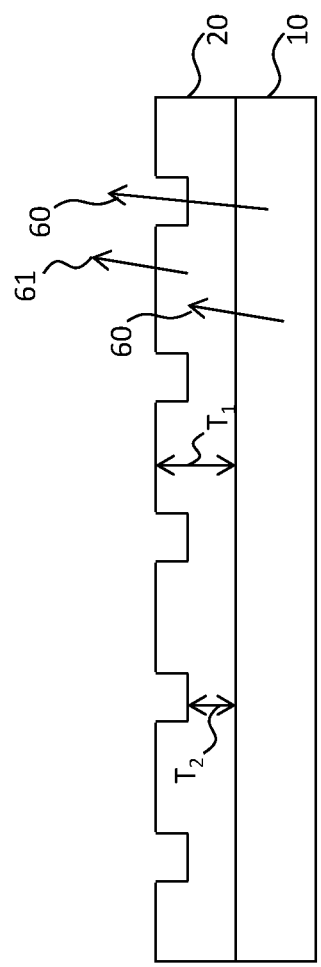
FIG. 8 is a cross section according to another embodiment of the present invention having three light emitters.

In alternative embodiments, the second light emitters 20 have a variation in thickness, for example made with templated epitaxial structures, or holes, using photolithographic methods. This variable thickness can result in multi-color light output. In such an embodiment, illustrated in FIG. 8, the second light emitter 20 has at least a first portion having a first thickness T1 and a second portion having a second thickness T2 less than the first thickness T1. The first thickness T1 is large enough to convert substantially all incident light (e.g. First light 60 emitted from the first light emitter 10) having an energy greater than the second energy to light of the second energy (second light 62). The second thickness T2 is small enough that a substantial amount of incident light (e.g. First light 60) having an energy greater than the second energy is not converted to light of the second energy and is emitted directly from the second light emitter 20, as shown. Again, light having a pre-determined combination of different colors (the first energy light and the second energy light) is emitted. In another embodiment of the present invention, the second light emitter 20 includes a light-extraction structure on or in a surface of the second light emitter 20 to reduce the quantity of trapped light in the second light emitter. Such structured second light emitters 20 can be made photolithographically.

Figure 9:
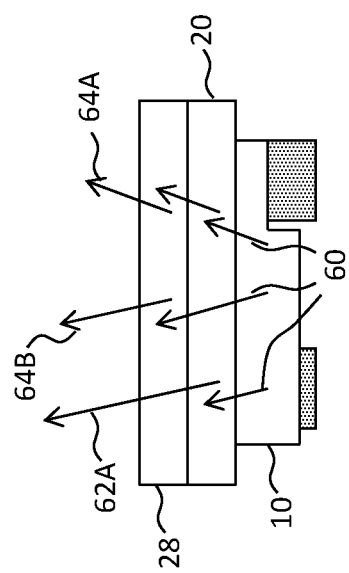
FIG. 9 is a cross section of a structured light emitter according to an embodiment of the present invention.

Referring to FIG. 9, in an alternative structure according to the present invention, the crystalline color-conversion device 5 includes an inorganic solid single-crystal direct-bandgap third light emitter 28 having a bandgap of a third energy less than the first energy and that is electrically isolated from the first light emitter 10. In one embodiment, the third light emitter 28 is located in optical association with the first light emitter 10 and is located within 0 to 250 microns of the first light emitter 10 so that in response to the electrical signal the first light emitter 10 emits first light that is absorbed by the third light emitter 28 and the third light emitter 28 emits third light having a lower energy than the first energy. The third light emitter can receive light emitted directly from the first light emitter 10 without passing through the second light emitter 20 (not shown). In another embodiment, the third light emitter 28 has a bandgap of a third energy less than the second energy, the third light emitter 28 is located in optical association with the second light emitter 20, and third light emitter 28 is located within 0 to 250 microns of the second light emitter 20 so that light emitted by the second light emitter 20 is absorbed by the third light emitter 28 and the third light emitter 28 emits third light having a lower energy than the second energy. By employing a third light emitter 28 in various structural arrangements, a broader range of frequencies are emitted by the crystalline color-conversion device 5, providing improved CRI.

As shown in FIG. 9, in an embodiment of the crystalline color-conversion device 5 of the present invention, an inorganic solid single-crystal direct-bandgap third light emitter 28 having a bandgap of a third energy less than the first energy is located on a side of the second light emitter 20 opposite the first light emitter 10. Various combinations of bandgap energies in the first, second, and third light emitters 10, 20, 28 and different thicknesses of the second and third light emitters 20, 28 can result in different combinations and quantities of light emitted from the structure. In one embodiment, at least a portion of the second light 62 emitted by the second light emitter 20 in response to the first light 60 from the first light emitter 10 is converted by the third light emitter 28 to third light 64A. In another embodiment, at least a portion of the first light 60 from the first light emitter 10 passes through the second light emitter 20 and is converted by the third light emitter 28 and emitted as third light 64B. In another embodiment, at least a portion of the first light 60 is converted by the second light emitter 20 and passes through the third light emitter 28 and is emitted as second light 62A.

Figure 10:
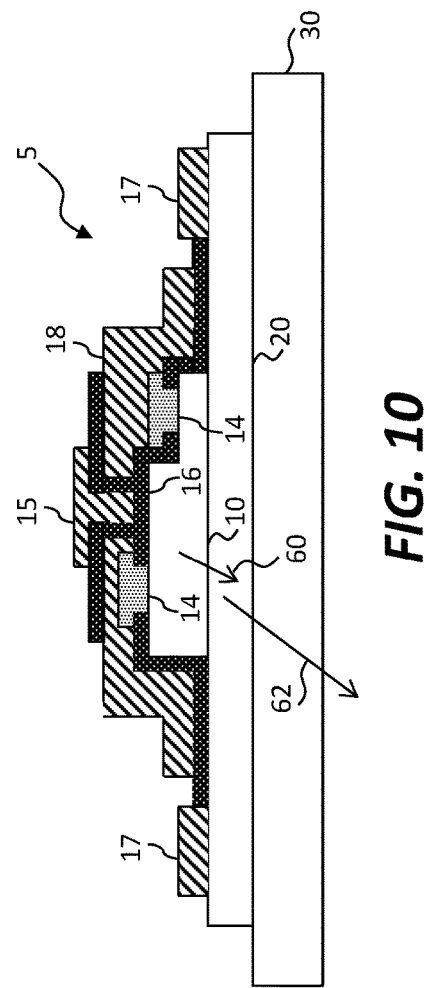
FIG. 10 is a cross section of an embodiment of the present invention including electrostatic gates.

Referring next to FIG. 10, in an embodiment of the present invention the crystalline color-conversion device 5 includes electrostatic gates 17 located on, over, under, or adjacent to near-edge regions of the second light emitter 20. In embodiments, the electrostatic gate 17 can be in contact with the second light emitter 20 or separated from the second light emitter by the dielectric 18. By placing a charge on the electrostatic gates 17, an electrical field is formed in the second light-emitter 20 that depletes carriers in the near-edge regions, thereby reducing non-radiative recombination. In an embodiment, the electrostatic gates 17 are electrically connected to one of the conductive wires 18 or, alternatively, the electrostatic gates 17 are electrically connected to a different charge source. Electrostatic gates 17 can be formed on the second light emitter 20 using photolithographic methods.

Figure 11:
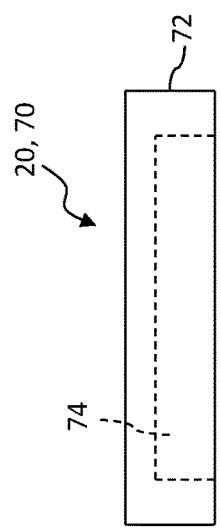
FIG. 11 is a cross section of an embodiment of the present invention including a heterostructure second light emitter.

As noted above, the second light emitter 20 can be a semiconductor. Referring to FIG. 11, in an embodiment the second light emitter 20 is a heterostructure 70 including two different semiconductor materials or two different semiconductor structures. Such a heterostructure can have, for example, a cladding layer 72 or passivation layer completely or at least partially surrounding an active photoluminescent layer 74. The cladding layer 72 can have a bandgap larger than the bandgap of the active photoluminescent layer 74. In an embodiment, the bandgap energy of the active photoluminescent layer 74 is lower than the bandgap energy of the first light emitter 10 and the bandgap energy of the cladding layer 72 is higher than the bandgap energy of the first light emitter 10 so that the first light 60 emitted by the first light emitter 10 is converted into emitted second light 62 by the photoluminescent layer 74 and not the cladding layer 72. In another embodiment, the bandgap energy of the cladding layer 72 is not higher than the bandgap energy of the first light emitter 10 but is sufficiently thin that relatively little of the first light 60 emitted by the first light emitter 10 is converted into emitted second light 62 by the cladding layer 72, for example the cladding layer 72 is thinner than the photoluminescent layer 74 as shown in FIG. 11. Such a heterostructure improves the efficiency of light emission.

The cladding layer 72 or passivation layer increases color-conversion efficiency by suppressing non-radiative recombination of photo-generated electrons and holes at the free surfaces of the second light emitter 20. Free surfaces of the second light emitter 20 can contribute to non-radiative recombination (a parasitic effect) due to the presence of surface states, traps, and/or surface contamination. Cladding layers 72 or passivation layers reduce or eliminate the effects of one or more of those sources of non-radiative recombination. Some passivation layers (e.g., some dielectric materials deposited by atomic layer deposition with in-situ passivation immediately prior to growth) suppress non-radiative recombination by reducing or eliminating the density of interface states at the interfaces between the photoluminescent materials and the passivation materials. Some passivation layers, such as higher-bandgap semiconductor cladding layers 72, reduce non-radiative recombination by forming electrostatic barriers that keep photo-generated carriers from traversing the interface between the photoluminescent material and the cladding material.

Core-shell nanoparticles are known as color-conversion materials that are more efficient than nano-particles without a cladding "shell." Many classes of electronic or optoelectronic devices (e.g., yield-effect transistors or solar cells) rely on surface passivation for efficient operation. Embodiments of the present invention apply surface-passivation strategies to the color-conversion structures of the present invention described herein.

A cladding layer 72 can be on one, some, or all sides of the second light emitter 20. In one embodiment, a cladding layer 72 is a planar epitaxial layer that has a bandgap energy higher than the bandgap energy of the photo-luminescent layer 74. In one embodiment the cladding layer 72 is InGaAlP, and the photo-luminescent layer is InGaP. In one embodiment the cladding layer 72 is InAlGaN, AlGaN, or InGaN having a higher bandgap than the photo-luminescent layer, and the photo-luminescent layer is InGaN having a lower bandgap than the cladding layer 72. In one embodiment, a cladding layer 72 is an epitaxial layer grown on the sidewalls and tops of mesas of a photoluminescent layer 74 as an epitaxial "overgrowth" ("overgrowth" refers to the second epitaxial process in the following sequence: form epitaxial materials in a first epitaxial process, do photolithography and etching or other micro-fabrication processes, then form more epitaxial materials in a second epitaxial (overgrowth) process). In some embodiments the tops and bottoms of the second light emitters 20 have cladding layers 72 and the sidewalls have no cladding or other passivation.

In some embodiments the tops and bottoms of the second light emitters 20 have cladding layers formed by epitaxial deposition processes and the sidewalls have passivation formed by atomic layer deposition or other chemical vapor deposition. In some embodiments all sides of the second light emitters 20 are passivated by hetero-epitaxial cladding layers 72.

In some embodiments one or more surfaces of the second light emitter 20 are passivated by ion processing. In an embodiment ion processing alters the electron- or hole-transport properties near one or more surfaces of the second light emitter 20 (e.g. the sidewalls) and inhibits trap-assisted non-radiative recombination there.

Figure 12:
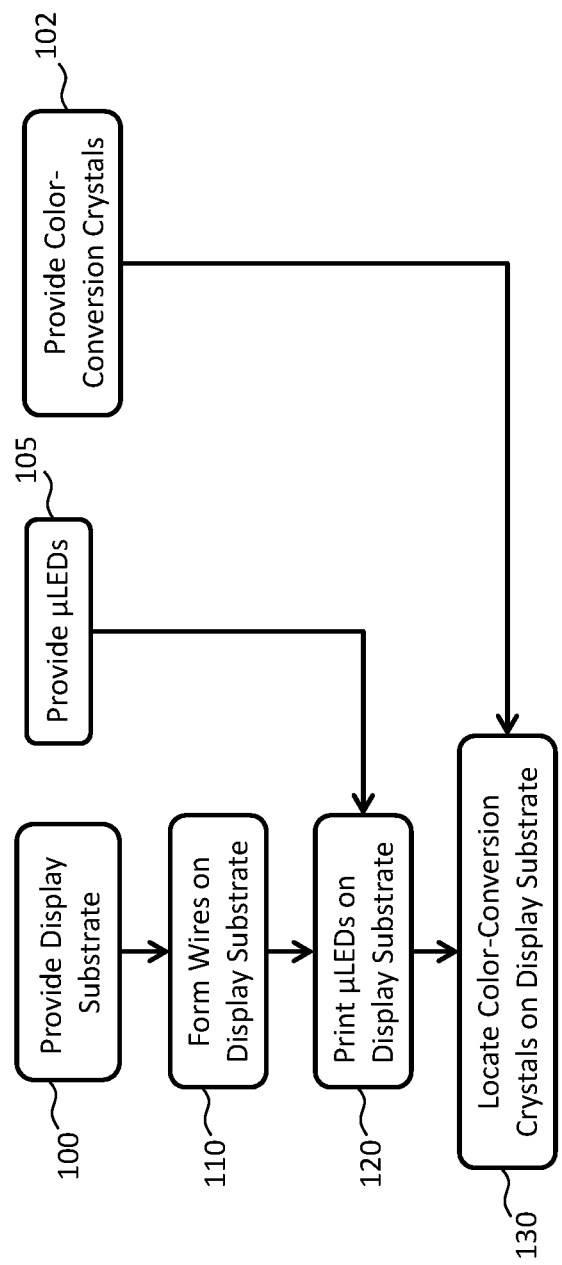
FIGS. 12-13 are flow charts illustrating methods of the present invention.

A method of the present invention is illustrated in the flow chart of FIG. 12. In step 100 a display substrate 30 is provided, in step 105 first light emitters 10 such as micro-LEDs are provided, and in step 102 color-conversion crystals are provided. The display substrate 30, in some embodiments, is a polymer, plastic, resin, polyimide, PEN, PET, metal, metal foil, glass. The first light emitters 10 can be small inorganic light-emitting diodes or micro-LEDs. A discussion of micro-LEDs and micro-LED displays can be found in U.S. patent application Ser. No. 14/743,981, filed Jun. 18, 2015, entitled *Micro Assembled Micro LED Displays and Lighting Elements*, which is hereby incorporated by reference in its entirety. The display substrate 30, micro-LED first light emitters 10, and color-conversion crystal second light emitters 20 can all be provided at the same or at different times and in any order.

Conductive wires 18 are formed on the display substrate 30 in step 110 and the micro-LED first light emitters 10 are located on the display substrate 30 in alignment with the conductive wires 18 in step 120, for example by micro-transfer printing. The color-conversion crystals are then located on the display substrate 30 within 0 to 250 microns of the micro-LEDs, in step 130, for example by micro-transfer printing the color-conversion crystals onto the micro-LEDs. This method can form a top-emitter structure, such as is shown in FIG. 6. Micro-transfer methods are described in U.S. Pat. Nos. 8,722,458, 7,622,367 and 8,506,867, each of which is hereby incorporated by reference.

Figure 13:
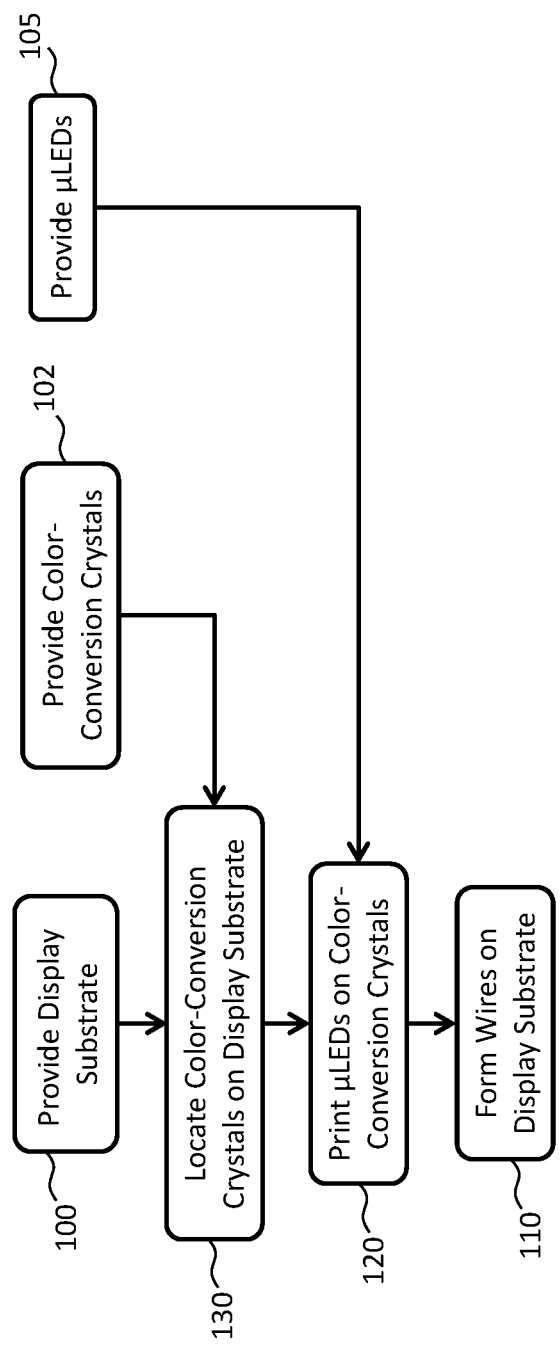

Alternatively, referring to the method of the present invention illustrated in the flow chart of FIG. 13, the step 130 of locating the color-conversion crystals is reversed with the step 120 of locating, for example by micro-transfer printing, the micro-LEDs and the step 110 of forming conductive wires 18 to electrically interconnect the micro-LEDs is performed after the micro-LEDs are located on the display substrate 30. This method can form a bottom-emitter structure, such as is shown in FIG. 2.

In another embodiment of the present invention, the first light emitters 10 are micro transfer printed onto the second light emitters 20 to form a light-emitting crystalline color-conversion structure 5. The crystalline color-conversion structure 5 is then micro-transfer printed onto a display substrate 30.

In an embodiment, a source substrate is provided, for example a semiconductor substrate that is an inorganic solid single-crystal direct-bandgap source substrate. The first light emitters 10 are micro transfer printed onto the source substrate, forming light-emitting crystalline color-conversion structures 5, and then the light-emitting crystalline color-conversion structures 5 are released from the source substrate, together with a portion of the source substrate forming the second light emitters 20 and micro transfer printed from the source substrate to a destination substrate, such as the display substrate 30. Structures useful for micro transfer printing, for example release layers, anchors, and tethers, can be formed in the source substrate before or after the first light emitters 10 are micro transfer printed onto the source substrate.

In an alternative embodiment, an inorganic solid single-crystal direct-bandgap layer is formed on a source substrate and the first light emitters 10 are disposed, for example by micro transfer printing, onto the layer, forming spatially separated light-emitting crystalline color-conversion structures 5 on the source substrate, and then the light-emitting crystalline color-conversion structures 5 are released from the source substrate and printed onto a destination substrate, such as the display substrate 30. Structures useful for micro transfer printing, for example release layers, anchors, and tethers, can be formed in the source substrate before or after the first light emitters 10 are micro transfer printed onto the source substrate 30.

In general, structures, features, and elements of the present invention can be made using photolithographic methods and materials found in the integrated circuit arts, the light-emitting diode arts, and the laser arts, for example including doped or undoped semiconductor materials, optically pumped crystals, conductors, passivation layer, electrical contacts, and controllers.

In another embodiment, the crystalline color-conversion devices 5 are arranged on tile substrates that are then mounted on and interconnected to a backplane substrate to form a compound micro-assembly. Depending on the implementation, different number of crystalline color-conversion devices 5 are located on each tile substrate and interconnected. In various embodiments, control circuitry is located on the tile substrates or the backplane substrate. A discussion of compound micro-assembly structures and methods is provided in U.S. patent application Ser. No. 14/822,868 filed Aug. 10, 2015, entitled *Compound Micro-Assembly Strategies and Devices*, which is hereby incorporated by reference in its entirety.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer there between.

Having described certain implementations of embodiments, it will now become apparent to one of skill in the art that other implementations incorporating the concepts of the disclosure may be used. Therefore, the invention should not be limited to the described embodiment, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

T1 first thickness
T2 second thickness
5 crystalline color-conversion device
5R crystalline color-conversion device
5G crystalline color-conversion device
5B crystalline color-conversion device
7 crystalline color-conversion display
10 first light emitter
11 light-emitting area
12 light-emitting layer
13 conduction layer
14 electrical contact
15 reflector
16 dielectric insulator
17 elecrostatic gate
18 conductive wire
20 second light emitter
22 material
28 third light emitter
30 substrate/display substrate
40 group/pixel group
60 first light
61 low-energy pump light
62 second light
62A second light
62B second light
64A third light
64B third light
70 semiconductor heterostructure
72 cladding layer
74 active luminescent layer
100 provide display substrate step
102 provide color-conversion crystals step
105 provide light emitters step
110 form wires on substrate step
120 print micro-LEDs on display substrate step
130 locate color-conversion crystals on micro-LEDs step

The invention claimed is:
1. A method of making a crystalline color-conversion device, comprising:
providing an electrically driven first light emitter for emitting first light having a first energy in response to an electrical current signal, wherein the electrically driven first light emitter is electrically connected to two or more electrical contacts that provide the electrical current signal to the first light emitter;

providing an optically driven inorganic solid single-crystal direct-bandgap second light emitter having a bandgap of a second energy less than the first energy; and micro transfer printing the second light emitter from a source substrate onto the first light emitter or micro transfer printing the first light emitter from a source substrate onto the second light emitter so that the second light emitter (i) is electrically isolated from the first light emitter so that current passing through the first light emitter does not pass through the second light emitter, (ii) is located in optical association with the first light emitter, and (iii) is located within 0 to 250 microns of the first light emitter such that in response to the electrical signal the first light emitter emits first light that is absorbed by the second light emitter and the second light emitter emits second light having a lower energy than the first energy.

2. The method of claim 1, wherein the first light emitter and the second light emitter form a light-emitting conversion structure and the method comprises micro-transfer printing the light-emitting conversion structure from a source substrate onto a display substrate.

3. The method of claim 1, comprising forming an inorganic solid single-crystal direct-bandgap layer on a source substrate and disposing the first light emitter onto the inorganic solid single-crystal direct-bandgap layer.

4. The method of claim 3, comprising etching the layer to form a plurality of spatially separated crystalline color-conversion devices on the source substrate.

5. The method of claim 4, comprising micro transfer printing the crystalline color-conversion devices from the source substrate to a display substrate.

6. The method of claim 1, comprising providing an inorganic solid single-crystal direct-bandgap source substrate and disposing the first light emitters onto the source substrate.

7. The method of claim 6, comprising etching the source substrate to form a plurality of spatially separated crystalline color-conversion devices.

8. The method of claim 7, comprising micro transfer printing the plurality of crystalline color-conversion devices from the source substrate to a display substrate.

* * * * *